United States Patent [19]

Stahura et al.

[11] Patent Number: 4,829,277
[45] Date of Patent: May 9, 1989

[54] ISOTROPIC RARE EARTH-IRON FIELD MAGNETS FOR MAGNETIC RESONANCE IMAGING

[75] Inventors: Daniel W. Stahura, Anderson, Ind.; Robert R. Lown, Tyngsboro, Mass.

[73] Assignee: General Motors Corporation, Detroit, Mich.

[21] Appl. No.: 933,005

[22] Filed: Nov. 20, 1986

[51] Int. Cl.$^4$ ............................................. H01F 1/04
[52] U.S. Cl. .................................. 335/306; 148/301; 148/302; 420/83; 420/121
[58] Field of Search ................ 335/306; 148/301–302; 420/83, 121

[56] References Cited

U.S. PATENT DOCUMENTS 4,538,130 8/1985 Gluckstern ........................ 335/306

FOREIGN PATENT DOCUMENTS

| 0108474 | 5/1984 | European Pat. Off. | ............ 148/302 |
| 0125752 | 11/1984 | European Pat. Off. | ............ 148/302 |
| 0124655 | 11/1984 | European Pat. Off. | . |
| 0238448 | 5/1984 | Japan | ................................ 148/302 |

OTHER PUBLICATIONS

R. W. Lee, "Hot-Pressed Neodymium-Iron-Boron Magnets", Appl. Phys. Lett., vol. 46, Apr. 1985, pp. 790–791.

Primary Examiner—John P. Sheehan
Attorney, Agent, or Firm—Elizabeth F. Harasek

[57] ABSTRACT

A ring magnet for creating a desired magnetic field within the bore of the ring is formed from a plurality of magnetized, magnetically isotropic magnets comprised of $RE_2TM_{14}B_1$ alloy. The invention has particular application to ring magnets for magnetic resonance imaging devices.

16 Claims, 1 Drawing Sheet

ISOTROPIC RARE EARTH-IRON FIELD MAGNETS FOR MAGNETIC RESONANCE IMAGING

This invention relates to improved ring magnets. More particularly, the invention relates to ring magnets for magnetic resonance imaging (MRI) which are made from magnetically isotropic rare earth-iron alloy.

Magnetic resonance imaging is a non-invasive diagnostic process by which cross-sectional views of selected regions of any part of the body can be obtained. The image intensity depends on the resonant excitation and relaxation of hydrogen nuclei in water, and fat molecules. Since the water and fat density of bones, organs and other tissues in the body vary, the signal relaxation strength and time vary and are capable of producing well defined images based on computer reductions of the data.

State of the art imaging systems rely on large rings made up of a plurality of anisotropic permanent magnets to form a primary magnetic bias field. The individual permanent magnets are magnetically oriented so as to obtain the strongest, most uniform flux field (i.e., bias field) possible within the hole or bore of the magnet rings. X, Y, and Z gradient radio coils are used to cause directional perturbations in the field created by the permanent magnet rings. The gradient coils are pulsed by a sequencer to cause perturbation of the magnetic field's pattern so that the nuclei in a limited volume, such as a cross-section through a portion of a person's body located in the bore of the magnet, are resonant. A radio receiver detects the nuclear magnetic resonance (nmr) signal from this region. The spatial information is contained in the resulting nmr spectra and an image can be reconstructed therefrom.

To obtain high resolution images, it is imperative that the primary bias field created by the permanent magnet rings be as uniform as possible. In order to provide a ring magnet hole large enough for full-body scanning (a diameter of approximately 80 centimeters), it is much preferred to use strong permanent magnets because bias field strength decreases with distance from the magnetic poles. Therefore, oriented, anisotropic, rare earth-cobalt, and iron neodymium-boron magnets have been used with energy products above 10 MGOe. The relatively low maximum energy product of anisotropic ferrite magnets (about 4 MGOe) make these materials impractical because of the weight of magnets required to produce a strong enough bias field.

K. Halbach has set forth a number of important design parameters for making multi-pole ring magnets. He deals specifically with oriented rare earth-cobalt ring magnets in the paper "Design of Permanent Multipole Magnets with Oriented Rare Earth Cobalt Material", *Nuclear Instruments and Methods*, Vol. 169 (1980) pages 1–10. Further study on the subject was done by Gluckstern and Holsinger which was reported in "Design of REC Permanent Magnet Quadrupoles Taking into Account B, H Non-linearity," at the proceedings of the Linear Accelerator Conference, held in Santa Fe, N. Mex., 1981. These papers concluded that a suitable anisotropic permanent bias field magnet must have magnetic permeability ($\mu$) approximately equal to one in directions both parallel and perpendicular to the magnetizing direction. That is $B_\parallel / H_\parallel = \mu_\parallel \simeq 1 \simeq \mu_\perp$.

In oriented anisotropic rare earth-cobalt and rare earth iron magnets, this permeability relationship holds true. Such magnets are formed by grinding alloy to particles which are smaller than about 5 microns in diameter so that each particle is substantially single domain size and magnetically anisotropic. The powder is then pressed in the presence of a magnetic field to obtain a preferred magnetic direction of orientation for the finished magnet. Once sufficient compact density (about 80%) is obtained, the particles can no longer move and they maintain their magnetic orientation through all further processing. The oriented and pressed powders are sintered, surface finished and magnetized before assembly into an MRI ring.

It is not now possible nor necessary to form a discrete ring of magnetic material to create a uniform MRI bias field. Instead, conventional MRI magnet rings are formed of a plurality of blocks of oriented anisotropic permanent magnets with suitable magnetic alignment. Before this invention it was believed that it was necessary to use anisotropic oriented magnets to prevent misalignment of the magnetic fields of the individual magnets in the assembly process of a ring. This is because a magnet sees appreciable magnetic force in a direction adverse to the desired magnetic direction as it is moved into position for MRI ring assembly.

Before this invention, theoretical and practical work with MRI ring magnets led experts to conclude that isotropic magnetic materials, i.e., those which can be magnetized to equal strength in any direction, could not be used in making MRI ring magnets. This is because known isotropic magnets such as unoriented samarium cobalt magnets do not have permeabilities approximately equal to one in direction both parallel and perpendicular to the direction of magnetic orientation. For example, relative permeability in the transverse direction ($\mu_\perp$) for samarium cobalt magnets which are made by simply compacting powder without applying a magnetic field and then sintering is typically in the range of 1.4–1.7. Therefore, such magnet would acquire a magnetization component in the wrong direction as it was assembled into a magnet ring. Moreover, it would be difficult to predict exactly what changes in the direction of magnetic alignment such a magnet would suffer. Furthermore, conventional unoriented, pressed and sintered RE-TM magnets have low energy products which do not justify their high cost.

BRIEF SUMMARY

In accordance with a preferred embodiment of this invention, MRI ring magnets are formed from a plurality of isotropic rare earth-iron based magnets. The preferred magnet alloys consist predominantly of a $RE_2TM_{14}B_1$ phase where RE is a rare earth element, TM is a transition metal element and B is boron. The most preferred compositions have a substantial amount of a $RE_2(Fe_{1-x}Co_x)_{14}B_1$ phase where neodymium and/or praseodymium comprise at least 60 percent of the RE and x is about 0.4 or less.

These isotropic alloys may be rapidly solidified from a melt to have a preferred grain size of about 400 to 500 nanometers or less. Melt-spinning is one preferred method of creating permanently magnetic alloys of such composition and microstructure. U.S. Ser. Nos. 414,936 and 544,728 to Croat filed Sept. 3, 1982 and Oct. 26, 1983, respectively, assigned to the assignee hereof and incorporated herein by reference, describe rare earth-iron magnet compositions and processes. Melt-spinning under suitable conditions results in brittle fragments of magnetically isotropic ribbon. Unlike the finely ground powder required to make oriented anisotropic RE-TM magnets, these ribbon fragments do not burn spontaneously in air. They can be roughly ground (10 micron or larger particles) and cold pressed without a protective atmosphere.

The individual magnets which form an MRI ring may be made, for example, by mixing melt-spun ribbon with a small amount of a dry epoxy powder. The mixture is cold pressed into a compact of the desired size and shape. The mixture compact is then heated to a temperature much lower than the sintering temperature (preferably less than 200° C.) for a short period of time to cure the epoxy and guarantee the integrity of the magnet block.

Very large blocks of desired shape can be made in this manner. Because the block itself and the particles within the block are magnetically isotropic, a finished block can be oriented with equal ease in any desired direction in a suitable magnetic field. Once oriented, the blocks can be assembled into a ring for the MRI device without losing desired magnetic alignment because of stray fields created by adjacent magnets. The unique magnetization behavior of isotropic RE-Fe-B based magnets which prevent misalignment will be described in greater detail hereinafter. If desired, the ring magnets can be fine tuned by strategic placement of magnets outside of the rings.

DETAILED DESCRIPTION

Figure 1:
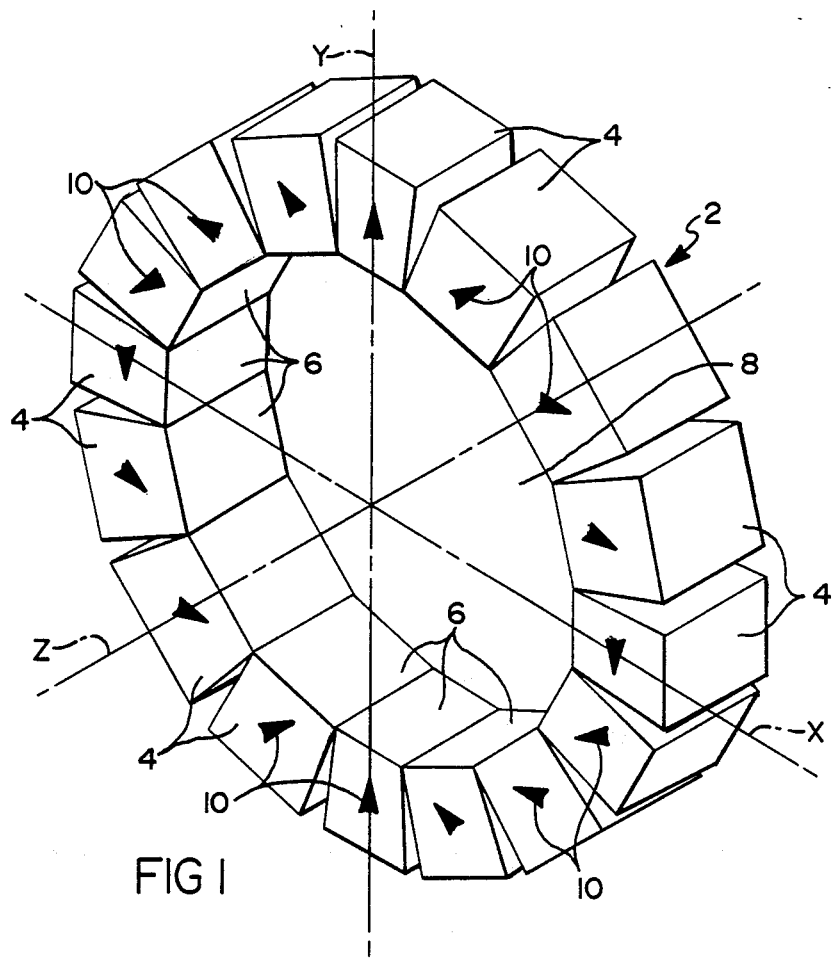

FIG. 1 is a three dimensional representation of a ring magnet 2 for an MRI device. The ring is comprised of sixteen magnetically isotropic blocks 4 having a trapedzoidal cross-sectional shape. The short, parallel face 6 of each block 4 abuts that of the adjacent blocks. The hole or bore 8 of the ring 2 preferably has a diameter of at least about 80 cm if it is to be used for cross-sectional scanning of the human body. The magnets of the ring of FIG. 1 are magnetized in the directions indicated by arrow points 10 before they are assembled into ring 2. The ring shown generates a linear magnetic field transverse to the z-axis with the field lines parallel to the y-axis.

Each block 4 is comprised predominantly of magnetically isotropic RE-TM-B alloy and as formed has no preferred direction of magnetic orientation. Each block is, therefore, easily magnetized with its north pole in any desired direction using conventional powder metal pressing (without a simultaneously applied magnetic field) and magnetizing technologies.

Assembled ring 2 could be fine-tuned by placing additional magnets of suitable orientation outside the ring as taught, for example, in U.S. Pat. No. 4,538,130 to Gluckstern, et al. However, it may not be necessary to tune the subject isotropic rings since the problems of magnetic misalignment encountered in ring assembly and prealignment of powder for sintered or bonded anisotropic magnets are either avoided or much reduced.

Key to the subject invention is the use of isotropic rare earth-transition metal-boron based alloys, particularly Nd and/or Pr, iron, boron alloys consisting predominantly of a $RE_2TM_{14}B_1$ phase. The most preferred compositions have an average crystal size of the 2-14-1 phase commensurate with single magnetic domain size which is less than about 400–500 nanometers. Alloys having such microstructure can be made by techniques such as rapid solidification of molten alloy as taught in U.S. Ser. Nos. 414,936 and 544,728; ibid., and high energy ball milling of fully crystalline ingots as described in U.S. Ser. No. 855,943 to Clemens filed July 15, 1986, also assigned to General Motors Corporation. Alloys containing at least about 6 atomic percent Nd and/or Pr, at least about 50 atomic percent iron and at least about 0.5 percent boron have been found to contain the 2-14-1 phase and have the desired magnetic properties.

These isotropic RE-TM-B magnets have energy products several times higher than ferrites but somewhat lower than anisotropic, oriented, pressed and sintered (OPS) samarium-cobalt and RE-TM-B. However, the lower energy product of isotropic RE-TM-B magnets (about 12–15 MGOe) is more than compensated for by their ease of formation, magnetization, assembly and lower cost.

Possible sizes and shapes for anisotropic OPS magnets are limited by the inability of those skilled in the art to provide suitable orienting fields for the fine, easily oxidized powder simultaneous with compaction. On the other hand, the subject melt-spun isotropic ribbons can be pressed into any shape by conventional powder metal techniques. For example, it would be well within the skill of the art to make radial arc segments which could be magnetized in continually varying directions and then assembled into a coherent MRI ring without spaces between magnets. This would create a very uniform field in the bore of the ring. There is no known practical way to do this using conventional anisotropic magnets and magnet making techniques.

The subject isotropic magnets may be made by bonding relatively large, very finely crystalline alloy powder particles with organic binders such as epoxies, polyurethanes, polyolefins, acrylates, etc. or inorganic binders such as lead, zinc, tin, etc. Fully dense magnets may also be formed from very finely crystalline material by pressing at an elevated temperature below about 750° C. as taught in U.S. Ser. No. 520,170 to Lee, filed Aug. 4, 1983, assigned to General Motors Corporation. It would also be possible to take near single domain size anisotropic RE-TM-B powder particles and press them in a protective atmosphere without a magnetic field and sinter the resultant compact. However, sintered magnets would have to be machined to tolerance before assembly.

As set forth in the "Background" section, before this invention those skilled in the art did not believe that isotropic magnets could be used to make MRI rings because no magnet known had parallel to perpendicular magnetic permeability ratios near unity. For example, unoriented, finely ground Sm-Co powder has a permeability value of about 1.4. The subject isotropic RE-TM-B magnets have an acceptable permeability ratio of about 1:1 or less.

Figure 2:
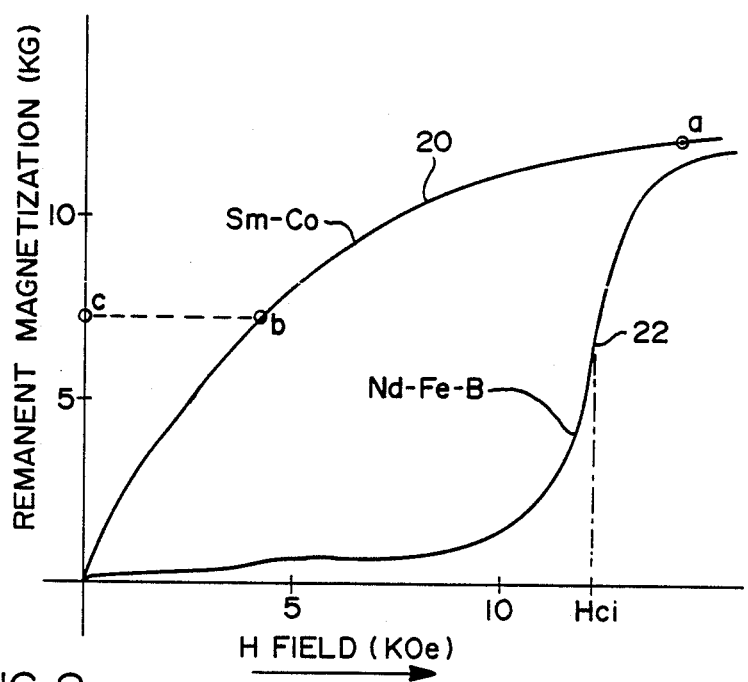

FIG. 2 is also helpful in understanding the subject invention. The Sm-Co curve of FIG. 2 shows a typical first quadrant magnetization curve 20 for a cube of sintered, unoriented, isotropic Sm-Co powder. If the cube were magnetized in the x-direction, the remanent magnetization would go up nearly linearly from zero to point A and the relative permeability would be about 1. However, if the magnetized cube were then subjected to a field of a few kiloOersteds in the y-direction, the first quadrant curve would travel from a point B to point C, for example. The relative permeability would be about 1.4 to 1.7. If the cube were allowed to magnetically coil, it would move along a line from point B to point C and would therefore have a substantial remanent component of magnetization not in the x-direction.

Similarly, a premagnetized block of isotropic Sm-Co would be exposed to stray fields of several kOe as it was moved into an MRI ring. It would therefore pick up a component of magnetization in an undesired direction. Since ferrite magnets have much lower coercivities than rare earth magnets, the adverse effects of assembling isotropic ferrites would be even more pronounced. Such assembly induced misalignment would result in unacceptable (and unpredictable) changes in the field within the bore of an MRI ring.

As seen further in FIG. 2, isotropic RE-TM-B materials have a first quadrant magnetization curve 22 much different than that of isotropic Sm-Co. The relative permeabilities of Mu($\parallel$) and Mu($\perp$) are in the range of about 1.0 to 1.1 for applied fields H less than $H_{ci}$. If a cube of RE-TM-B material is magnetized in a field greater than $H_{ci}$ in the x-direction and then exposed to a field weaker than $H_{ci}$ in the y or any other direction, the magnet would not experience any significant misalignment from the premagnetized direction. Unlike Sm-Co, the remanence in isotropic RE-TM-B rises very slowly until $H_{ci}$ is almost reached.

The maximum stray field seen by a magnet as it is assembled into an MRI ring made up of magnets with energy products of about 20 MGOe or less is only about 6 kOe or less. This is below the $H_{ci}$ of isotropic RE-TM-B magnets (about 10 kOe for overquenched and annealed $Nd_{0.14}Fe_{0.80}B_{0.06}$) and accordingly, the stray field seen by such magnets as they are introduced into an MRI ring does not cause any significant misalignment. Thus a very uniform field which may need very little tuning is created in the hole of an isotropic RE-TM-B MRI ring.

Our invention has been described particularly with respect to ring magnets for MRI devices. Clearly, the invention also has application with respect to all multipole focusing field magnets such as quadrupole magnets used to focus particle beams. Thus, while our invention has been described in terms of specific embodiments thereof, other forms may be readily adapted by one skilled in the art. Accordingly, the invention is to be limited only by the following claims.

The embodiments of the invention in which an exclusive property or privilege is claimed are defined as follows:

1. A ring magnet for creating a desired magnetic field within the hole of said ring, said magnet comprising an assembly of segments comprising bonded, permanently magnetic, magnetically isotropic, very finely crystalline particles of an alloy, the principal phase of which alloy is $RE_2TM_{14}B_1$, said segments being magnetized in desired directions before assembly into said ring magnet and said magnetized segments being resistant to magnetic misalignment by magnetic fields created by other said segments during assembly of the ring magnet.

2. A ring magnet for creating a bias magnetic field in a magnetic resonance imaging device, said ring magnet comprising an assembly of segments comprising bonded, permanently magnetic, magnetically isotropic, very finely crystalline particles of an alloy, the principal phase of which alloy is $RE_2TM_{14}B_1$, said segments being magnetized in desired directions before assembly into said ring magnet, said magnetized segments being resistant to magnetic misalignment by magnetic fields created by other said segments during assembly of the ring magnet.

3. A ring magnet for creating a desired magnetic field within the hole of said ring, said magnet comprising an assembly of segments comprising bonded, permanently magnetic, magnetically isotropic, very finely crystalline particles of an alloy, the principal phase of which alloy is $RE_2TM_{14}B_1$, said segments being magnetized in desired directions before assembly into said ring magnet and said magnetized segments being resistant to magnetic misalignment by magnetic fields less than about 10 kOe.

4. A ring magnet for creating a desired magnetic field within the hole of said ring, said magnet comprising an assembly of segments comprising bonded, permanently magnetic, magnetically isotropic, very finely crystalline particles of an alloy, the principal phase of which alloy is $RE_2TM_{14}B_1$, said segments being magnetized in desired directions before assembly into said ring magnet and said magnetized segments having magnetic remanence less than about 5 kG in magnetic fields less than about 10 kOe.

5. A ring magnet for creating a desired magnetic field within the hole of said ring, said magnet comprising an assembly of segments comprising bonded, permanently magnetic, magnetically isotropic, rapidly solidified, very finely crystalline particles of an alloy comprising one or more rare earth elements selected from the group consisting of neodymium and praseodymium, iron and boron, the principal phase of which alloy is $RE_2TM_{14}B_1$, said segments being magnetized in desired directions before assembly into said ring magnet and said magnetized segments developing a remanence less than about 5 kG in magnetic fields having strengths less than the $H_{ci}$ of the alloy.

6. The ring magnet of claim 1 where Nd and/or Pr comprises at least about 6 atomic percent, Fe comprises at least about 50 atomic percent and B comprises at least about 0.5 atomic percent of the alloy.

7. The ring magnet of claim 2 where Nd and/or Pr comprises at least about 6 atomic percent, Fe comprises at least about 50 atomic percent and B comprises at least about 0.5 atomic percent of the alloy.

8. The ring magnet of claim 1 where the remanence of the first quadrant magnetization curve of the alloy rises very slowly in magnetic fields having strengths less than about 10 KOe.

9. The ring magnet of claim 2 where the remanence of the first quadrant magnetization curve of the alloy rises very slowly in magnetic fields having strengths less than about 10 KOe.

10. The ring magnet of claim 1 where Nd and/or Pr comprises at least about 6 atomic percent, Fe comprises at least about 50 atomic percent and B comprises at least about 0.5 atomic percent of the alloy and the remanence of the first quadrant magnetization curve of the alloy rises very slowly in magnetic fields having strengths less than about 10 KOe.

11. The ring magnet of claim 2 where Nd and/or Pr comprises at least about 6 atomic percent, Fe comprises at least about 50 atomic percent and B comprises at least about 0.5 atomic percent of the alloy and the remanence of the first quadrant magnetization curve of the alloy rises very slowly in magnetic fields having strengths less than about 10 KOe.

12. The ring magnet of claim 1 where the particles are bonded by a polymeric bonding agent.

13. The ring magnet of claim 1 where the particles are bonded by hot pressing.

14. The ring magnet of claim 1 where the particles are bonded by a metallic bonding agent.

15. A ring magnet for creating a desired magnetic field within the hole of said ring, said magnet comprising an assembly of segments comprising bonded, permanently magnetic, magnetically isotropic, very finely crystalline particles of an alloy, the principal phase of which alloy is $RE_2TM_{14}B_1$ and where Nd and/or Pr comprises at least about 6 atomic percent, Fe comprises at least about 50 atomic percent, Co comprises from about 0 to 40 percent based on Fe, and B comprises at least about 0.5 atomic percent of the alloy, said segments being magnetized in desired directions before assembly into said ring magnet and said magnetized segments being resistant to magnetic misalignment by magnetic fields created by other said segments during assembly of the ring magnet.

16. A ring magnet for creating a bias magnetic field in a magnetic resonance imaging device, said ring magnet comprising an assembly of segments comprising bonded, permanently magnetic, magnetically isotropic, very finely crystalline particles of an alloy, the principal phase of which alloy is $RE_2TM_{14}B_1$ and where Nd and/or Pr comprises at least about 6 atomic percent, Fe comprises at least about 50 atomic percent, Co comprises from about 0 to 40 percent based on Fe, and B comprises at least about 0.5 atomic percent of the alloy, said segments being magnetized in desired directions before assembly into said ring magnet, said magnetized segments being resistant to magnetic misalignment by magnetic fields created by other said segments during assembly of the ring magnet.

* * * * *